United States Patent
Joshi

(10) Patent No.: US 9,006,889 B2
(45) Date of Patent: Apr. 14, 2015

(54) FLIP CHIP PACKAGES WITH IMPROVED THERMAL PERFORMANCE

(71) Applicant: Skyworks Solutions, Inc., Woburn, MA (US)

(72) Inventor: Jaydutt J. Joshi, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/674,813

(22) Filed: Nov. 12, 2012

(65) Prior Publication Data

US 2013/0119535 A1 May 16, 2013

Related U.S. Application Data

(60) Provisional application No. 61/559,010, filed on Nov. 11, 2011.

(51) Int. Cl.
*H01L 23/498* (2006.01)
*H01L 21/50* (2006.01)
*H01L 23/36* (2006.01)
*H01L 23/367* (2006.01)
*H01L 23/373* (2006.01)
*H01L 23/31* (2006.01)
*H01L 21/56* (2006.01)

(52) U.S. Cl.
CPC .......... *H01L 23/49811* (2013.01); *H01L 21/50* (2013.01); *H01L 23/498* (2013.01); *H01L 2224/16225* (2013.01); *H01L 23/3121* (2013.01); *H01L 21/56* (2013.01); *H01L 21/561* (2013.01); *H01L 23/36* (2013.01); *H01L 23/3677* (2013.01); *H01L 23/3736* (2013.01); *H01L 23/49816* (2013.01)

(58) Field of Classification Search
USPC ......... 257/737, 738, 778, 685, 686, 777, 723, 257/712, 713, 717, 720, 676, 734, 675
See application file for complete search history.

(56) References Cited

U.S. PATENT DOCUMENTS

| | | | | | |
|---|---|---|---|---|---|
| 5,866,943 | A | * | 2/1999 | Mertol | 257/712 |
| 5,942,795 | A | * | 8/1999 | Hoang | 257/692 |
| 6,156,980 | A | * | 12/2000 | Peugh et al. | 174/252 |
| 6,268,239 | B1 | * | 7/2001 | Ikeda | 438/122 |
| 6,657,864 | B1 | * | 12/2003 | Dyckman et al. | 361/704 |
| 7,071,550 | B2 | * | 7/2006 | Sato | 257/706 |
| 7,269,017 | B2 | * | 9/2007 | Berlin et al. | 361/719 |
| 7,782,624 | B2 | * | 8/2010 | Fujii | 361/720 |
| 8,462,511 | B2 | * | 6/2013 | Lee | 361/721 |
| 8,575,769 | B2 | * | 11/2013 | Pagaila et al. | 257/796 |
| 8,698,258 | B2 | * | 4/2014 | Nagarkar et al. | 257/419 |
| 2002/0109226 | A1 | * | 8/2002 | Khan et al. | 257/737 |
| 2004/0099944 | A1 | * | 5/2004 | Kimura | 257/706 |
| 2005/0199998 | A1 | * | 9/2005 | Chen et al. | 257/706 |
| 2006/0151203 | A1 | * | 7/2006 | Krueger et al. | 174/260 |
| 2006/0170094 | A1 | * | 8/2006 | Subramanian et al. | 257/706 |

(Continued)

*Primary Examiner* — Alexander Oscar Williams

(74) *Attorney, Agent, or Firm* — Knobbe, Martens, Olson & Bear, LLP

(57) ABSTRACT

Systems and methods for improving thermal performance, such as thermal dissipation, of flip chip packages that include one or more flip chip dies are disclosed. In some embodiments, a thermal collection layer can be formed on a surface of a flip chip die. The thermal collection layer can be configured to dissipate heat generated by the flip chip die. In some variations, the thermal collection layer can be constructed using materials having high thermal conductivity.

25 Claims, 5 Drawing Sheets

(56) References Cited

U.S. PATENT DOCUMENTS

| | | | |
|---|---|---|---|
| 2007/0040255 A1* | 2/2007 | Osone et al. | 257/678 |
| 2009/0168367 A1* | 7/2009 | Fujii | 361/720 |
| 2010/0096747 A1* | 4/2010 | Kusano | 257/706 |
| 2011/0018114 A1* | 1/2011 | Pagaila et al. | 257/686 |
| 2011/0037164 A1* | 2/2011 | Kwon et al. | 257/709 |
| 2011/0278717 A1* | 11/2011 | Pagaila et al. | 257/737 |
| 2011/0291249 A1* | 12/2011 | Chi et al. | 257/675 |
| 2012/0115279 A1* | 5/2012 | Bonthron et al. | 438/108 |
| 2013/0043581 A1* | 2/2013 | Negoro | 257/712 |
| 2013/0081796 A1* | 4/2013 | Horiuchi et al. | 165/185 |
| 2013/0093068 A1* | 4/2013 | Pagaila | 257/660 |
| 2013/0093074 A1* | 4/2013 | Grant | 257/693 |
| 2013/0105963 A1* | 5/2013 | Choi et al. | 257/706 |
| 2013/0118008 A1* | 5/2013 | Gaynes et al. | 29/836 |
| 2013/0241039 A1* | 9/2013 | Choi et al. | 257/659 |
| 2013/0299974 A1* | 11/2013 | Chi et al. | 257/737 |
| 2014/0332948 A1* | 11/2014 | Mohammed et al. | 257/712 |

* cited by examiner

FLIP CHIP PACKAGES WITH IMPROVED THERMAL PERFORMANCE

CROSS-REFERENCE TO RELATED APPLICATIONS

This disclosure claims priority to U.S. Provisional Application No. 61/559,010, filed on Nov. 11, 2011, the disclosure of which is expressly incorporated by reference herein in its entirety.

TECHNICAL FIELD

The present disclosure relates generally to flip chip packages. More specifically, the present disclosure relates to flip chip packages having improved thermal performance.

BACKGROUND

Flip chip die are directly connected to carriers (e.g., substrates, circuit boards, and the like) via conductive bumps that are placed on the surface of the dies. In contrast to traditional wire bonding techniques, interconnection between the flip chip die and the carrier occurs via conductive bumps. In particular, the die having conductive bumps is flipped and placed face down so that conductive bumps are directly attached to the carrier, thereby forming a flip chip package or a module.

One advantage of flip chip packages is that they are typically smaller than traditional wire bonded packages with same functionality. The size can be significant for portable electronic devices, such as cellular phones, smart phones, portable MP3 players, and the like. As sizes of flip chip packages continue to decrease, improving their thermal performance becomes even more significant. In some instances, thermal performance can be improved by attaching a heat sink to the flip chip package. In many situations, however, it may not be possible to attach a heat sink to a flip chip package due to various factors, including small size of the package, limited space in an electronic device that incorporates the package, and the like.

SUMMARY

In accordance with some embodiments, the present disclosure relates to a flip chip package with improved thermal performance. In certain implementations, the package includes a substrate configured to support a flip chip die, the flip chip die including a first surface mounted on the substrate and a second surface. A thermal collection layer is mounted on, formed on, or attached to (e.g., coated sprayed, plated, etc.) the second surface of the flip chip die, the thermal collection layer configured to dissipate heat generated by the flip chip die. In some embodiments, the package includes a plurality of bump connections interposed between the substrate and the first surface of the flip chip die. In some embodiments, a second die is interposed between the flip chip die and the substrate. In some variations, the thermal collection layer includes copper.

Some embodiments of the present disclosure relate to a multi-chip package with improved thermal performance. In certain implementations, the multi-chip includes a substrate configured to support a plurality of flip chip dies, each flip chip die from the plurality of flip chip dies including a first surface mounted on the substrate and a second surface. A thermal collection layer is mounted on, formed on, or attached to the second surface of each flip chip die from the plurality of flip chip dies, the thermal collection layer configured to dissipate heat generated by the plurality of flip chip dies. According to some embodiments, a plurality of bump connections is interposed between the substrate and the first surface of each flip chip die from the plurality of flip chip dies. In some variations, the package includes a mold configured to protect the package and enclose a plurality of exposed surfaces of the plurality of flip chip dies. For some implementations, the package includes a power amplifier die, a controller die, and a switch die.

Certain embodiments of the present disclosure relate to a method of manufacturing a package with improved thermal performance. The package includes a flip chip die with a plurality of surfaces. In some embodiments, the method includes mounting a first surface of the plurality of surfaces of the flip chip die on a substrate and enclosing exposed surfaces of the plurality of surfaces of the flip chip die with a mold. The method further includes removing a portion of the mold to expose a second surface of the plurality of surfaces of the flip chip die, the second surface of the plurality of surfaces of the flip chip die opposite the first surface of the plurality of surfaces of the flip chip die, and mounting, forming or attaching a thermal collection layer on the second surface of the plurality of surfaces of the flip chip die. The thermal collection layer is configured to dissipate heat generated by the flip chip die. In some variations, the method includes interposing a plurality of bump connections between the substrate and the first surface of the plurality of surfaces of the flip chip die.

According to some embodiments, the method includes mounting on, forming on, or attaching to a substrate a first surface of a plurality of surfaces of a second flip chip die, enclosing exposed surfaces of the plurality of surfaces of the second flip chip die with the mold, and removing a portion of the mold to expose a second surface of the plurality of surfaces of the second flip chip die. The second surface of the plurality of surfaces of the second flip chip die is opposite the first surface of the plurality of surfaces of the second flip chip die. In certain embodiments, the method includes mounting, forming, or attaching a thermal collection layer on the second surface of the plurality of surfaces of the second flip chip die, the thermal collection layer further configured to dissipate heat generated by the second flip chip die.

Certain embodiments of the present disclosure relate to a wireless device. In some variations, the wireless device includes an antenna configured to transmit and receive signals, a battery configured to power the wireless device, and a circuit board including a flip chip package. The flip chip package includes a flip chip die including a first surface mounted on a substrate and a second surface, the substrate mounted on the phone board, the substrate configured to support the flip chip die. A thermal collection layer is mounted on, formed on, or attached to the second surface of the flip chip die, the thermal collection layer configured to dissipate heat generated by the flip chip die. In certain implementations, the flip chip package includes a second flip chip die that includes a first surface and second surface, the first surface of the second flip chip die mounted on the substrate, and the thermal collection layer mounted on, formed on, or attached to the second surface of the second flip chip die.

BRIEF DESCRIPTION OF THE DRAWINGS

Throughout the drawings, reference numbers are reused to indicate correspondence between referenced elements. The drawings are provided to illustrate embodiments of the inventive subject matter described herein and not to limit the scope thereof.

DETAILED DESCRIPTION

The headings provided herein, if any, are for convenience only and do not necessarily affect the scope or meaning of the claimed invention.

Overview

Embodiments of the present disclosure provide systems and methods for improving thermal performance, such as thermal dissipation, of flip chip packages that include one or more flip chip dies. In some embodiments, a thermal collection layer can be attached to a surface of a flip chip die located opposite the surface that is mounted on a carrier (e.g., substrate, circuit board, and the like). The thermal collection layer can be configured to dissipate heat generated by the flip chip package (e.g., heat generated by the flip chip die when it is active). In some variations, the thermal collection layer can be constructed using materials having high thermal conductivity, such as copper, copper alloys, gold, gold alloys, silver, silver alloys, diamond, aluminum, aluminum alloys, copper-tungsten alloys, silicon carbide in aluminum matrix (AlSiC), diamond in copper-silver alloy matrix, and the like.

Advantageously, embodiments of the present disclosure provide for improved thermal performance of flip chip packages as compared to traditional approaches, such as those utilizing heat sinks that are attached to the packages. Improvement of thermal performance encompasses improvement of thermal dissipation (e.g., cooling) and reduction of thermal resistance. In turn, this can enable packaging functionality with high power consumption, which may typically require using larger packages, into smaller packages, such as packages of 2×2×0.75 mm or smaller, 3×3×0.9 mm, 4×3×0.9, 4×4×0.9 mm, and 4×7×1.1 mm, 7 mm×4 mm×1.05 mm, and 8×7×1.4 mm or larger. In some embodiments, any suitable package size can be used. In addition, improved thermal performance can result in a more efficient operation and, thereby, in conservation of power (e.g., battery power).

Further, in many instances, utilizing heat sinks for cooling is not feasible. The reasons can include small size of flip chip packages, limited space within electronic devices that incorporate the packages, and the like. Embodiments of the present disclosure can lessen or eliminate the need to use heat sinks, which, in addition to reducing the overall size of flip chip packages, can reduce the costs of production.

Packages with Improved Thermal Performance

Figure 1:
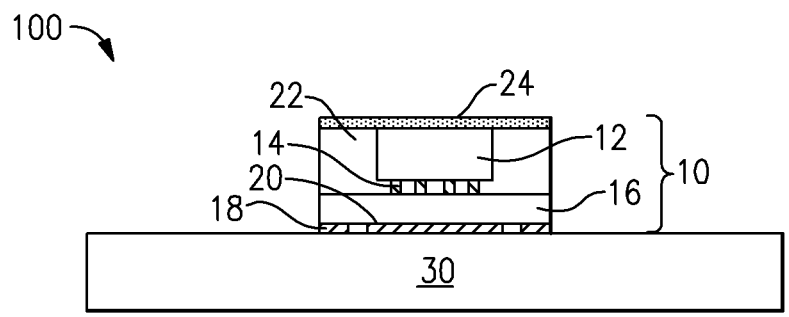
FIG. 1 illustrates an embodiment of a flip chip package having a thermal collection layer, the package mounted on a circuit board in accordance with aspects of the present disclosure.

FIG. 1 illustrates an embodiment 100 of a flip chip package having a thermal collection layer, the flip chip package mounted on a circuit board in accordance with aspects of the present disclosure. As is illustrated, the flip chip package 10 includes a flip chip die 12 (such as a power amplifier, switch, controller, and the like) mounted on a substrate 16 (e.g., laminate) using pillar or solder bump connections 14 interposed between the die and substrate. Bump connections 14 can be electrically connected to one or more signal and/or power connections 18 and a ground connection 20 at the bottom side of the substrate 16. Routing of such connections (not shown) between the two sides of the substrate 16 can be achieved in a number of ways. In some embodiments, as is explained below, the bump connections 14 can be constructed using materials having high thermal conductivity, such as copper, copper alloys, gold, gold alloys, silver, silver alloys, diamond, aluminum, aluminum alloys, copper-tungsten alloys, silicon carbide in aluminum matrix (AlSiC), diamond in copper-silver alloy matrix, and the like.

In certain embodiments, the flip chip die 12 can be enclosed or encapsulated by, for example, an over-mold structure 22 configured to provide protection for the flip chip die. The foregoing mounting of the die 12 on the substrate 16 and encapsulation of the flip chip die 12 can yield an assembly that is typically referred to as a flip chip package 10. Such flip chip package(s) can be fabricated and supplied, for example, to an electronic device manufacturer (e.g., wireless device manufacturer), for assembling on a circuit board 30 (e.g., wireless phone board).

In some implementations, electrical connections between the flip chip die 12 and the substrate 16 can be achieved directly via the bump connections 14. Accordingly, a resulting flip chip assembly having a given functionality is typically much smaller than traditional carrier-based systems. Further, short electrical paths provided by the bump connections 14 can significantly reduce inductance, thereby facilitating, for example, higher operating frequencies.

In some variations, besides providing electrical connectivity, bumps connections 14 can be configured to provide thermal conductivity. In some embodiments, the bump connections 14 illustrated in FIG. 1 can provide heat conduction pathways from the flip chip die 12 to the substrate 16. Such heat can then be transferred to the circuit board 30. Heat removed from the die 12 can accumulate in the board 30, and can thus contribute to overheating of the board. This can be exacerbated by other flip chip packages and/or increased density of components mounted on the board 30.

In some embodiments, the flip chip package 10 includes a thermal collection layer 24. The thermal collection layer 24 can improve thermal performance of the flip chip package 10. The thermal collection layer 24 can be configured to dissipate heat generated by the flip chip package 10. In some variations, the thermal collection layer 24 preferably includes copper and/or copper alloys, although other materials having high thermal conductivity can be used, such as gold, gold alloys, silver, silver alloys, diamond, aluminum, aluminum alloys, copper-tungsten alloys, silicon carbide in aluminum matrix (AlSiC), diamond in copper-silver alloy matrix, and the like. In addition, the thermal collection layer 24 can provide radio frequency (RF) and/or electromagnetic interference (EMI) shielding for the flip chip package 10. In certain embodiments, as is illustrated in FIG. 1, the thermal collection layer 24 can be attached to a surface of the die 12 that is opposite the surface mounted on the substrate 16.

In some variations, the flip chip package 10 can include one or more additional dies (not shown). For example, the die 12 can be mounted or stacked on another die, such as another flip chip die. The thermal collection layer 24 can provide a preferred conduction path for heat generated by the die 12 because transferring heat in the direction opposite the thermal collection layer 24 (i.e., toward another die) may impair the operation or damage the die on which the die 12 is stacked.

Figure 2:
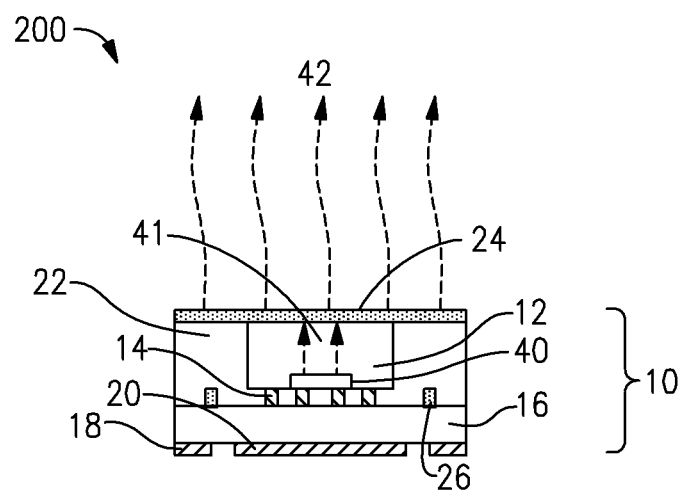
FIG. 2 illustrates an embodiment of a flip chip package having a thermal collection layer in accordance with aspects of the present disclosure.

FIG. 2 illustrates an embodiment 200 of a flip chip package having a thermal collection layer in accordance with aspects of the present disclosure. The flip chip package 10 can include surface mount components 26 mounted directly on the substrate 16 using surface mount technology (SMT). Components 26 can include passive components, such as resistors, capacitors, inductors, diodes, active components, such as transistors, or a combination thereof. As is illustrated, the flip chip die 12 can have a heat source 40. For instance, the heat source 40 can be a power supply of the die 12. The heat source 40 generates heat represented by arrows 41. In some embodiments, heat can flow through the die 12 and be transferred by the thermal collection layer 24 to a fluid medium (e.g., air) surrounding the flip chip package 10. As is illustrated by arrows 42, heat can be conducted away from both the heat source 40 and the flip chip die 12, thereby providing a cooling effect. In other words, the thermal collection layer 24 can help dissipate heat generated by the heat source 40. In certain embodiments, as is illustrated, the thermal collection layer 24 can extend beyond the surface of the die 12 in order to increase the cross-sectional area through which heat is transferred, which in turn can increase the rate of conduction of heat.

Figure 3:
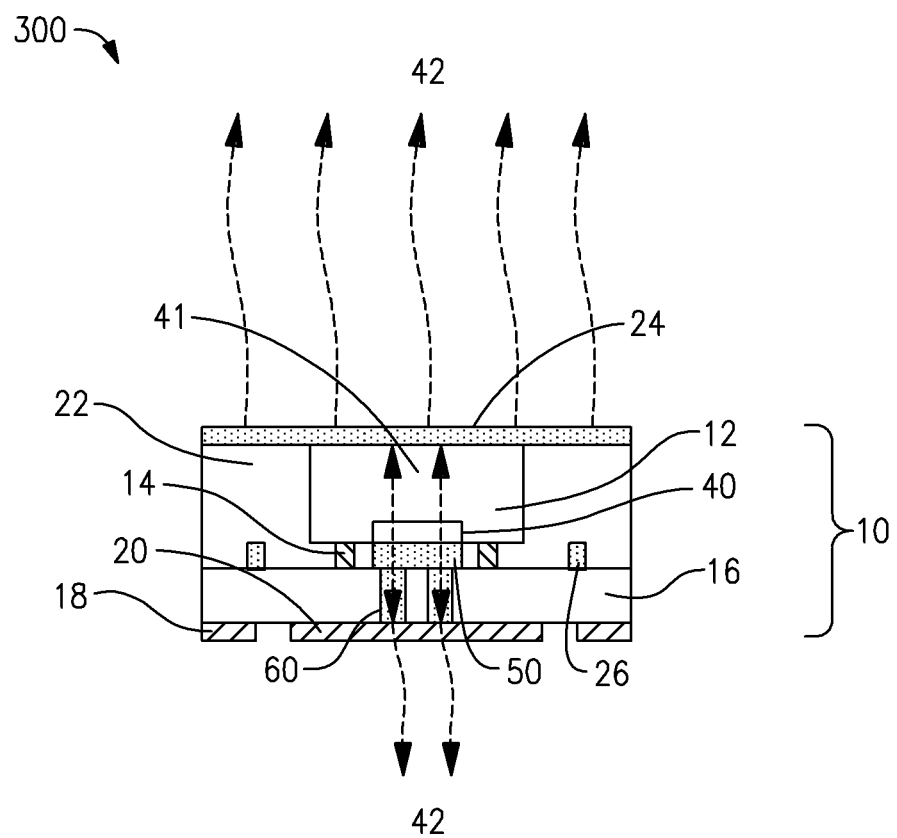
FIG. 3 illustrates another embodiment of a flip chip package having a thermal collection layer in accordance with aspects of the present disclosure.

FIG. 3 illustrates an embodiment 300 of a flip chip package having a thermal collection layer in accordance with aspects of the present disclosure. The flip chip package 10 can include a second thermal collection layer 50 attached to the surface opposite the surface on which the thermal collection layer 24 is attached. The second thermal collection layer 50 can be configured to dissipate heat generated by the flip chip package 10 (e.g., heat generated by the heat source 40). In some implementations, the substrate 16 can include one or more through wafer vias 60 to facilitate the conduction of heat through the substrate. Through wafer vias can be constructed using materials having high thermal conductivity, such as copper, copper alloys, gold, gold alloys, silver, silver alloys, diamond, aluminum, aluminum alloys, copper-tungsten alloys, silicon carbide in aluminum matrix (AlSiC), diamond in copper-silver alloy matrix, and the like. As is illustrated by arrows 42, heat can be conducted away from the heat source 40 by the second thermal collection layer 50, through wafer vias 60, and transferred to a fluid medium (e.g., air) surrounding the package 10.

In some embodiments, additional through wafer vias can be included. For example, the vias can be placed so as to contact the bump connections 14. In certain embodiments, bump connections can be constructed using materials having high thermal conductivity. In some implementations, the additional thermal collection layer 50 can extend further than illustrated in FIG. 3. For example, the layer 50 can extend to the bump connections 14, to the edges of the die 12, or beyond the edges of the die. In some variations, the flip chip package 10 can include other thermal collection layers, such as layers placed on one or more vertical sides of the flip chip die 12.

Fabricating Packages with Improved Thermal Performance

Figure 4:
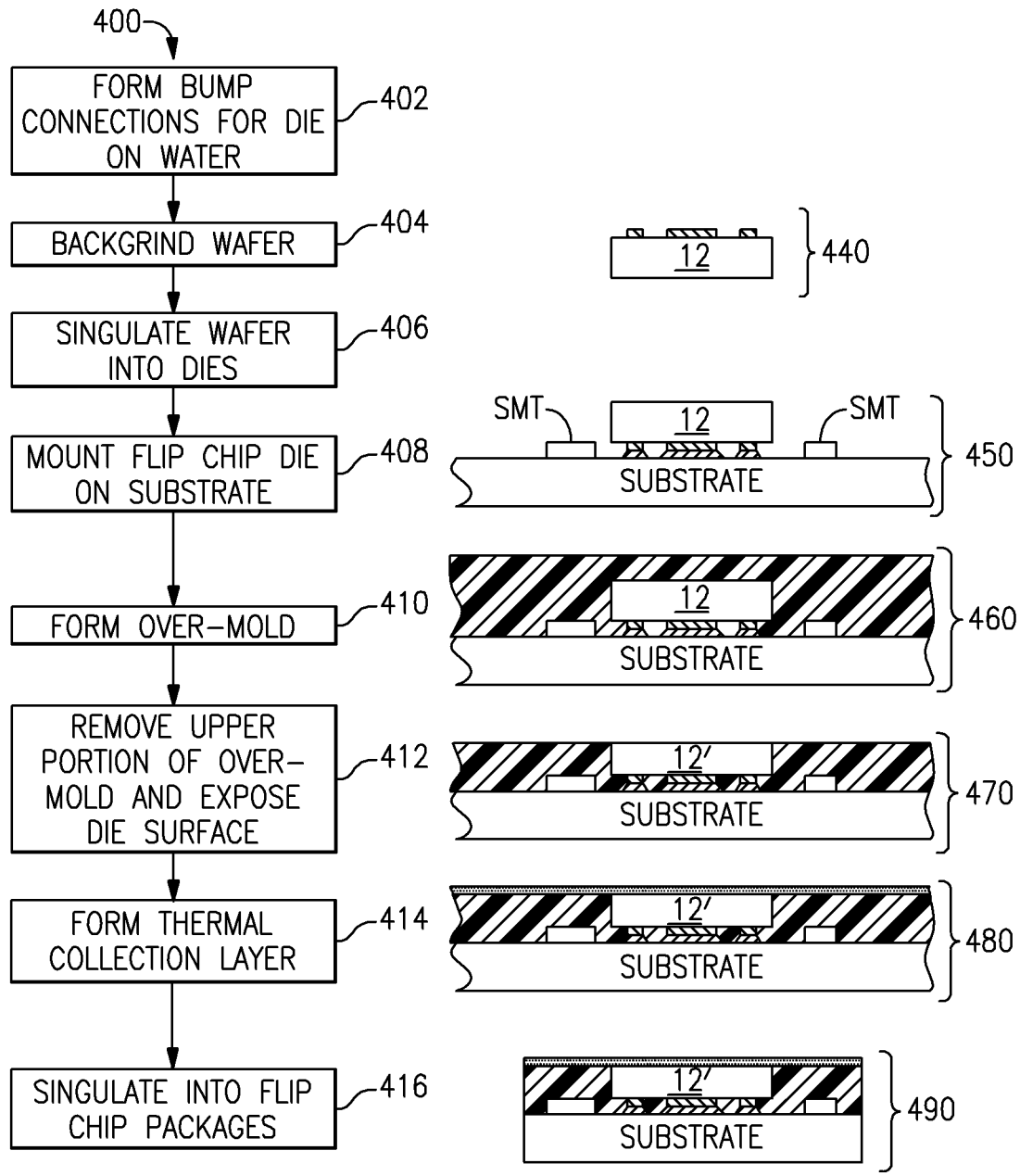
FIG. 4 illustrates a flowchart of a process for manufacturing a flip chip package in accordance with aspects of the present disclosure.

FIG. 4 illustrates a flowchart of a process 400 for making (e.g., fabricating) a flip chip package in accordance with aspects of the present disclosure. Although a single flip chip package is illustrated in 440, 450, 460, 470, 480, and 490, the process 400 can be used to fabricate a plurality of flip chip packages. In addition, the process 400 can be utilized for fabricating any suitable type of a flip chip package, such as ball grid array (e.g., plastic ball grid array or PBGA), dual flat pack no lead (DFN), flat no-leads (e.g., micro leadframe or MLF), mini small-outline package (MSOP), multi-chip module (MCM), small outline integrated circuit (SOIC), and the like.

The process 400 begins in block 402 where bump connections, such as bump connections 14, are formed on each die on a wafer having a plurality of dies. The wafer can be constructed using any suitable material, such as silicon (Si), gallium arsenide (GaAs), germanium (Ge), and the like. In some variations, the wafer can undergo backgrinding in block 404 in order to reduce the thickness of the wafer. This may be advantageous for stacking and, particularly, in high density packaging. In block 406 the wafer is singulated (or cut) into individual dies. One such singulated die 12 having bump connections is illustrated in 440.

In block 408, the singulated die 12 is (or a plurality of singulated dies are) mounted on a substrate 16. As is illustrated in 450, the die 12 is mounted on the substrate 16 in a flip chip configuration. In particular, the die 12 is flipped and mounted on the substrate 16 such that the bump connections make contact with the substrate. In some embodiments, solder dots or balls deposited on the bump connections in block 402 are remelted, thus attaching the die 12 to the substrate 16. In some embodiments, the bump connections (e.g., bump connections 14) can be constructed using material that remains rigid despite the increase in temperature during remelting. For example, the material can include copper, copper alloys, gold, gold alloys, silver, silver alloys, diamond, aluminum, aluminum alloys, copper-tungsten alloys, silicon carbide in aluminum matrix (AlSiC), diamond in copper-silver alloy matrix, and the like. Accordingly, the plurality of dies can be attached to the substrate in substantially vertically aligned positions. In other words, when mounted to the substrate 16, the vertical position of each die of the plurality of dies is within a small tolerance relative to the other dies. In some embodiments, one or more dies with improved thermal performance, such as via application of a thermal collection layer 24, can be of the same or substantially same thickness (or height) whereas other dies can have different thickness. In certain implementations, copper bump connections can have a height of approximately 0.22 mm or less, such as 40-80 microns, which can facilitate the vertical alignment.

In block 410, an over-mold structure 22 that provides protection for the flip chip die 12 is formed. For example, the over-mold structure 22 can be constructed using epoxy resin. As is illustrated in 460, the over-mold structure 22 can enclose the exposed sides of the flip chip die 12 mounted on the substrate 16, including left, right, and top sides. In block 412, a portion of the over-mold structure 22 can be removed (e.g., by sanding) to expose a side of the flip chip die 12'. This is further illustrated in 470.

In block 414, the thermal collection layer 24 is formed or applied to the exposed side of the flip chip die 12', as is illustrated in 480. In some embodiments, a material (or a combination of materials) having high thermal conductivity is plated on the exposed side of the flip chip die 12'. The thermal collection layer 24 can be formed on the exposed sides of the plurality of dies mounted in vertically aligned positions on the substrate 16. In block 416, the assembly is singulated or cut into flip chip packages. One such package is illustrated in 490. Although the package as shown includes a single flip chip die 12', multiple dies can be included in the package, as is explained below.

Additional Packages with Improved Thermal Performance

Figure 5:
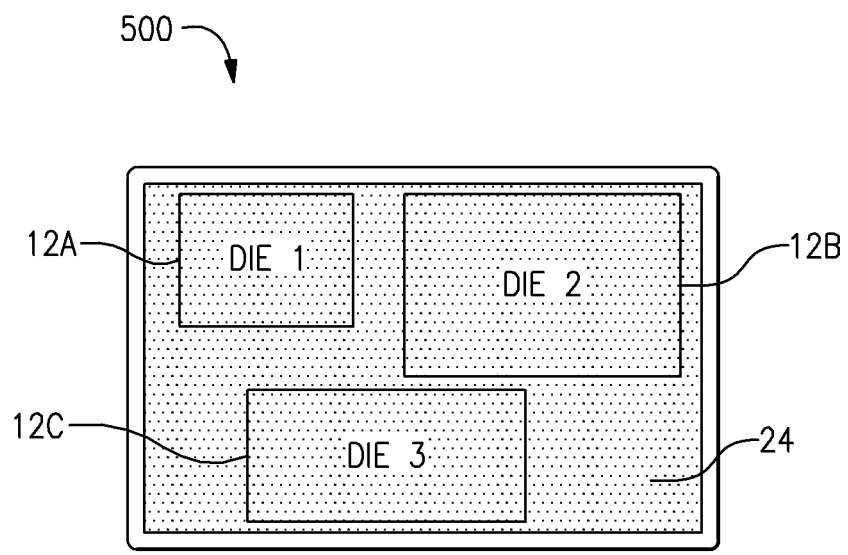
FIG. 5 illustrates a top view of a flip chip package having a plurality of flip chip dies in accordance with aspects of the present disclosure.

FIG. 5 illustrates a flip chip package 500 having a plurality of flip chip dies in accordance with aspects of the present disclosure. In particular, FIG. 5 shows a top view of the package 500. In some implementations, the package 500 can be a front-end module for a wireless communication device, such as a cellular phone. Die 12A can be a power amplifier, die 12B can be a switch (e.g., a RF Tx/Rx switch), and die 12C can be a controller. Dies 12A, 12B, and 12C can be mounted on a common substrate (not shown), and further can be enclosed or encapsulated by, for example, an over-mold structure to protect the dies. Further, a thermal collection layer 24 can be formed on or attached to the surfaces of dies 12A, 12B, 12C. As described above, the thermal collection layer 24 can improve thermal performance (e.g., thermal dissipation) of the package 500. The thermal collection layer 24 can also provide radio frequency (RF) and/or electromagnetic interference (EMI) shielding for the package 500 and dies 12A, 12B, and 12C. In certain embodiments, the package 500 can include additional dies or include less dies than is illustrated in FIG. 5.

Figure 6:
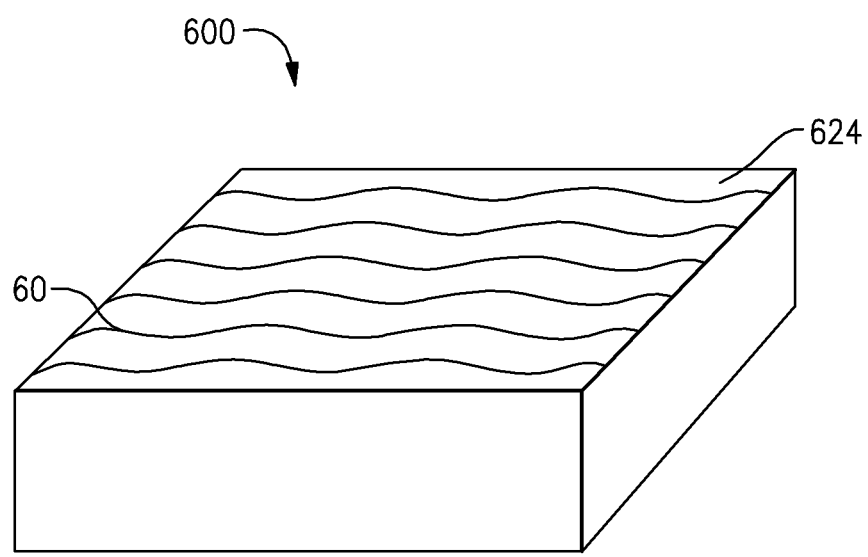
FIG. 6 illustrates a perspective view of a flip chip package having a thermal collection layer in accordance with aspects of the present disclosure.

FIG. 6 illustrates a perspective view of a flip chip package 600 having a thermal collection layer in accordance with aspects of the present disclosure. In some embodiments, a thermal collection layer 624 can be configured to have an increased (as compared to an etch-free or smooth-surfaced collection layer) surface area that is in contact with a cooling fluid (e.g., air), which in turn can increase the rate of conduction of heat. As is shown, the exposed surface of the thermal collection layer 624 can be etched to have grooves 60, such as V-shaped grooves. In certain embodiments, the thermal collection layer 624 can be etched, impressed, imprinted, or the like with any other suitable pattern that increases the surface area, such as a line pattern. In some variations, the thermal collection layer 624 can include fins.

Figure 7:
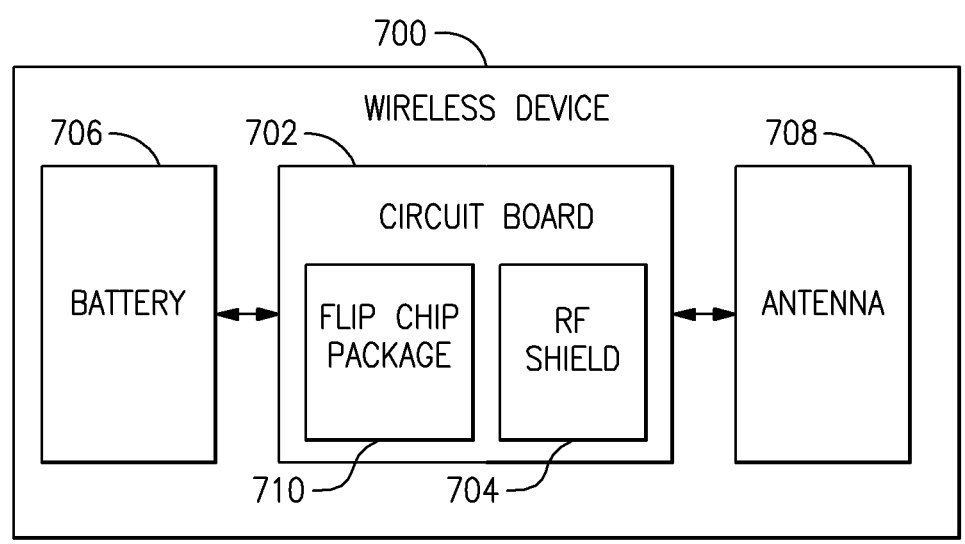
FIG. 7 illustrates an electronic device in accordance with aspects of the present disclosure.

FIG. 7 illustrates an electronic device 700 in accordance with aspects of the present disclosure. In some embodiments, the device 700 can be a portable wireless device, such as a cellular phone. The device 700 can include a battery 706 configured to supply power to the device, a circuit board 702 configured to provide support for and interconnect various electronic components, and an antenna 708 configured to receive and transmit wireless signals. The electronic device 700 can include a number of additional components, such as a display processor, central processor, user interface processor, memory, etc.

The circuit board 702 (e.g., a phone board) can include an RF shield 704 configured to provide radio frequency (RF) and/or electromagnetic interference (EMI) shielding for the electronic components of the circuit board 702, such as such as a flip chip package 710. The RF shield 704 can be positioned to shield from interference caused by signals received and/or transmitted by the antenna 708. In some embodiments, the RF shield 704 can be positioned to cover the entire or substantially entire circuit board 702 in order to shield the board from interference. In various embodiments, the RF shield 704 can additionally be positioned to cover the battery 706 in order to shield it from interference. The flip chip package 710 can include one or more flip chip dies. Further, the flip chip package 710 can include a thermal collection layer (not shown) as described above. The thermal collection layer can improve thermal performance (e.g., thermal dissipation) of the package 710 and provide additional radio frequency (RF) and/or electromagnetic interference (EMI) shielding.

TERMINOLOGY

Unless the context clearly requires otherwise, throughout the description and the claims, the words "comprise," "comprising," "include," "including," "have," "having," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the present disclosure using the singular or plural number may also include the plural or singular number respectively. The words "or," "and," and "and/or" used in reference to a list of two or more items cover all of the following interpretations of the word: any of the items in the list, all of the items in the list, and any combination of the items in the list.

The present disclosure is not intended to be exhaustive or to limit the invention to the precise form disclosed. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A package comprising:
   a substrate configured to support a flip chip die, the flip chip die including a first surface mounted on the substrate and a second surface opposite the first surface;

a first thermal collection layer formed on the first surface of the flip chip die, the first thermal collection layer configured to dissipate heat generated by the flip chip die; and a second thermal collection layer formed on the second surface of the flip chip die, the second thermal collection layer configured to dissipate heat generated by the flip chip die, the substrate including at least one via formed along a thickness of the substrate and configured to facilitate conduction of heat away from the flip chip die, the at least one via including thermally conductive material configured to provide a thermal conductive path between the first thermal collection layer and a fluid medium surrounding the package.

2. The package of claim 1 further comprising a plurality of bump connections interposed between the substrate and the first surface of the flip chip die.

3. The package of claim 2 wherein the plurality of bump connections include copper.

4. The package of claim 1 further comprising a second die interposed between the flip chip die and the substrate, wherein the first die is mounted on the second die.

5. The package of claim 1 further comprising a mold configured to protect the flip chip die and enclose a plurality of exposed surfaces of the flip chip die.

6. The package of claim 1 wherein at least one of the first and second thermal collection layers includes copper.

7. A multi-chip package comprising:

a substrate configured to support a plurality of flip chip dies, each flip chip die from the plurality of flip chip dies including a first surface mounted on the substrate and a second surface opposite the first surface;

a first thermal collection layer formed on the first surface of at least one flip chip die from the plurality of flip chip dies, the first thermal collection layer configured to dissipate heat generated by the at least one flip chip die; and a second thermal collection layer formed on the second surface of each flip chip die from the plurality of flip chip dies, the thermal collection layer configured to dissipate heat generated by the plurality of flip chip dies, the substrate including at least one via formed along a thickness of the substrate and configured to facilitate conduction of heat away from the at least one flip chip die, the at least one via including thermally conductive material configured to provide a thermal conductive path between the first thermal collection layer and a fluid medium surrounding the package.

8. The package of claim 7 further comprising a plurality of bump connections interposed between the substrate and the first surface of each flip chip die from the plurality of flip chip dies.

9. The package of claim 8 wherein the plurality of bump connections include copper.

10. The package of claim 7 further comprising a mold configured to protect the package and enclose a plurality of exposed surfaces of the plurality of flip chip dies.

11. The package of claim 7 wherein at least one of the first and second thermal collection layers includes copper.

12. The package of claim 7 wherein the plurality of flip chip dies includes a power amplifier die, a controller die, and a switch die.

13. The package of claim 7 further comprising another die interposed between at least one flip chip die of the plurality of flip chip dies and the substrate, wherein the at least one flip chip die is mounted on the another die.

14. The package of claim 1 wherein at least one of the first and second thermal collection layers includes an etched surface having an increased surface area.

15. The package of claim 7 wherein at least one of the first and second thermal collection layers includes an etched surface having an increased surface area.

16. The package of claim 1 wherein the at least one via is in direct contact with the first thermal collection layer.

17. The package of claim 1 wherein a cross sectional area of the second thermal collection layer is greater than a cross sectional area of the second surface of the flip chip die so that heat dissipation through the second thermal collection layer is increased.

18. The package of claim 14 wherein the etched surface includes one or more grooves.

19. The package of claim 18 wherein the one or more grooves includes one or more V-shaped grooves.

20. The package of claim 1 wherein at least one of the first and second thermal collection layers includes one or more fins formed on a surface of the at least one of the first and second thermal collection layers.

21. The package of claim 7 wherein the at least one via is in direct contact with the first thermal collection layer.

22. The package of claim 7 wherein a cross sectional area of the second thermal collection layer is greater than a cross sectional area of the second surface of the at least one flip chip die so that heat dissipation through the second thermal collection layer is increased.

23. The package of claim 15 wherein the etched surface includes one or more grooves.

24. The package of claim 23 wherein the one or more grooves includes one or more V-shaped grooves.

25. The package of claim 7 wherein at least one of the first and second thermal collection layers includes one or more fins formed on a surface of the at least one of the first and second thermal collection layers.

* * * * *